United States Patent
Boehm et al.

(10) Patent No.: US 9,832,584 B2
(45) Date of Patent: Nov. 28, 2017

(54) METHOD FOR MEASURING HOA LOUDNESS LEVEL AND DEVICE FOR MEASURING HOA LOUDNESS LEVEL

(71) Applicant: Dolby Laboratories Licensing Corporation, San Francisco, CA (US)

(72) Inventors: Johannes Boehm, Goettingen (DE); Florian Keiler, Hannover (DE)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/761,109

(22) PCT Filed: Jan. 9, 2014

(86) PCT No.: PCT/EP2014/050316
§ 371 (c)(1),
(2) Date: Jul. 15, 2015

(87) PCT Pub. No.: WO2014/111308
PCT Pub. Date: Jul. 24, 2014

(65) Prior Publication Data
US 2015/0373473 A1 Dec. 24, 2015

(30) Foreign Application Priority Data

Jan. 16, 2013 (EP) .................................... 13305047

(51) Int. Cl.
*H04S 3/00* (2006.01)
*H03G 5/00* (2006.01)
*H03G 9/00* (2006.01)

(52) U.S. Cl.
CPC ............. *H04S 3/008* (2013.01); *H03G 5/005* (2013.01); *H03G 9/005* (2013.01); *H04S 2400/13* (2013.01); *H04S 2400/15* (2013.01); *H04S 2420/11* (2013.01)

(58) Field of Classification Search
CPC ........ H03G 5/005; H03G 9/005; H04S 3/008; H04S 2400/13; H04S 2420/11; H04S 2400/15
See application file for complete search history.

(56) References Cited

U.S. PATENT DOCUMENTS

| 8,290,180 B2 | 10/2012 | Yamada |
| 2009/0238370 A1 | 9/2009 | Rumsey et al. |
| 2012/0155653 A1* | 6/2012 | Jax ........................ G10L 19/008 381/22 |

(Continued)

FOREIGN PATENT DOCUMENTS

| CN | 101373961 | 2/2009 |
| EP | 2450880 | 5/2012 |

OTHER PUBLICATIONS

ATSC A/85, "Techniques for establishing and maintaining audio loudness for digital television", Advanced television Systems Committee, Washington, D.C., Jul. 25, 2011; pp. 1-76.

(Continued)

*Primary Examiner* — Muhammad N Edun

(57) ABSTRACT

The invention relates to Higher-Order Ambisonics (HOA) Content Loudness Level Adjustment. A method for adjusting a loudness level of a HOA audio signal on a transmitting side comprises steps of measuring loudness of only the W-channel of the HOA audio signal, and leveling HOA master gain for all channels of the HOA signal according to the measured loudness of the W-channel.

23 Claims, 5 Drawing Sheets

(56) References Cited

U.S. PATENT DOCUMENTS

2014/0146970 A1* 5/2014 Kim .................. H04R 5/00
381/17

OTHER PUBLICATIONS

EBU Technical Recommendation R128, "Loudness Normalization and Permitted Maximum Level of Audio Signals", Geneva, 2010. http://tech.ebu.ch/docs/r/r128.pdf; pp. 1-5.
ITU-R Recommendation BS.17720-2, "Algorithms to measure audio programme loudness and true-peak audio level", Geneva 2011; pp. 1-24.
Zotter et al., "Energy-Preserving Ambisonic Decoding", ACTA Acustica United with Acustica, vol. 98 (2012), pp. 37-47.
ISO/IEC JTC1/SC29/WG11/N13196, "Calibration of 22.2 multi-channel sound reproduction", Audio Subgroup, Oct. 2012, Shanghai, China; pp. 1-3.
Zotter et al., "All-Round Ambisonic Panning and Decoding", J. Audio End. Soc., vol. 60, No. 10, Oct. 2012; pp. 807-820.
Boehm et al., "Test items for MPEG-H Audio", 102. MPEG Meeting, Shanghai, ISO/IEC JTC1/SC29/WG11, No. m26657, Oct. 17, 2012; pp. 1-14.
Pallone et al., "Use cases and possible Material for 3D Audio", 99, MPEG Meeting, Feb. 6, 2012-Feb. 10, 2012 San Josa CR, ISO/IEC JTC1/SC29/WG11, No. m23748; pp. 1-8.
Search Report dated Jul. 4, 2014.
ATSC A/85:2011, "Techniques for establishing and maintaining audio loudness for digital television", Advanced television Systems Committee, Washington, D.C., Jul. 25, 2011, pp. 1-76.

* cited by examiner

METHOD FOR MEASURING HOA LOUDNESS LEVEL AND DEVICE FOR MEASURING HOA LOUDNESS LEVEL

This application claims the benefit, under 35 U.S.C. §365 of International Application PCT/EP2014/050316, filed Jan. 9, 2014, which was published in accordance with PCT Article 21(2) on Jul. 24, 2014 in English and which claims the benefit of European patent application No. 13305047.6, filed Jan. 16, 2013.

FIELD OF THE INVENTION

This invention relates to loudness level adjustment for Higher-Order Ambisonics (HOA) content. In particular, it relates to a method for measuring a HOA loudness level and a device for measuring a HOA loudness level.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Soundfield signals such as e.g. Ambisonics carry a representation of a sound field. The Ambisonics format is based on spherical harmonics decomposition of the soundfield. While the basic Ambisonics format or B-format uses spherical harmonics of order zero and one, the so-called Higher Order Ambisonics (HOA) uses also further spherical harmonics of at least $2^{nd}$ order. That is, a HOA signal comprises different partial signals of different order N, such as a signal of order zero (W-channel, N=0), one or more signals of order one (N=1), one or more signals of order two (N=2) etc. A decoding process is required to obtain the individual loudspeaker signals. In order to synthesize audio scenes, panning functions that refer to the spatial loudspeaker arrangement are required for obtaining a spatial localization of the given sound source.

One task to be performed at the decoder side is setting up a replay level. As described in the prior art [1] and shown in FIG. 1, the amplifier gain $G_l$ of each loudspeaker feed is set such that a digital full band pink noise input with −18 $dBFS_{rms}$ results in a Sound Pressure Level (SPL) of 78+/−5 dBA. In FIG. 1, a pink noise test signal is used to level adjust the sound pressure level of each loudspeaker 13 by adjusting the speaker amplification $G_l$ in an amplifier 12, for each loudspeaker individually. A digital pink noise test signal is converted in a D/A converter 11 to an analog signal. SPL level adjustment in mixing and presentation venues and loudness level adjustment of content in the mixing room enables constant perceived loudness when switching between programs or items.

Content Loudness Level Calibration

If the replay levels of mixing facility and presentation venues are set-up in this manner, switching between items or programs should be possible without further level adjustments. For channel based content, this is simply achieved if the content is tuned to a pleasant loudness level at the mixing site. The reference for the pleasant listening level can either be the loudness of the whole item itself or an anchor signal.

Using the whole item itself as reference is useful for 'short form content', if the content is stored as a file. Besides adjustment by listening, a measurement of the loudness in Loudness Units Full Scale (LUFS) according to EBU R128 [2] can be used for loudness adjustment of the content. An alternative name for LUFS is 'Loudness, K-weighted, relative to Full Scale' from ITU-R BS.1770 [3] (1LUFS=1LKFS). Unfortunately, the solution in [2] only supports content for setups up to 5-channel surround. Loudness measures of 22-channel files, where all 22 channels are factored by equal channel weights of one, may correlate with perceived loudness, but there is no evidence or proof by thorough listing tests yet.

When using an anchor signal such as a dialog as a reference, the level is selected in relation to this signal. This is useful for 'long form content' such as film sound, live recordings and broadcasts. An additional requirement, extending the pleasant listening level, is intelligibility of the spoken word here.

Again besides an adjustment by listening, the content may be normalized related to a loudness measure, such as defined in ATSC A/85 [4]. First parts of the content are identified as anchor parts. Then a measure as defined in [3] is computed, or these signals and a gain factor to reach the target loudness is determined. The gain factor is used to scale the complete item. Unfortunately, again the maximum number of channels supported is restricted to five.

FIG. 2 from ITU-R BS.1770 [3] shows a loudness measure as used in EBU R128 [2] and ATSC A/85 [4]. [2] proposes to gain adjust the measured loudness of the whole content item to −23 dBLKFS. In [4], only the anchor signal loudness is measured and the content is gain adjusted that the anchor parts reach a target loudness of −24 dBLKFS. Various input signals L,R,C,Ls,Rs are filtered in K-Filters 21, the power of each channel is averaged in power averagers 22, each channel is weighted 23 and the weighted signals are added up 24 to obtain a measured loudness value 25.

Out of artistic considerations, content has to be adjusted at the mixing studio. This is done by individual listening. Automatic loudness measures can be used as a support and for showing that a specified loudness is not exceeded.

For HOA and Audio Object (AO) based content, but also Channel Based content that has to be remixed to a different number or different position of loudspeakers, rendering has to be taken into account. There need to be special characteristics a renderer has to fulfill, and such a renderer has to be used at the mixing studio as well as at the presentation venue of the consumer.

SUMMARY OF THE INVENTION

In view of the above, one problem to be solved is that replay of decoded audio data should be perceived with equal loudness, in particular when switching between different audio items or when rendering to different loudspeaker setups. The present invention solves at least this problem.

In principle, the invention comprises measuring the loudness of only the W-channel of the audio signal (i.e. the partial signal of $0^{th}$ order of the soundfield signal), and leveling (i.e. adjusting the level of) the master gain for all channels of the signal according to the measured loudness of the W-channel.

According to one embodiment of the invention, a method for adjusting a loudness level of a HOA audio signal comprises steps of measuring loudness of the W-channel of the HOA audio signal, and leveling the HOA master gain for all coefficient channels of the HOA signal according to the measured loudness of the W-channel, in order to obtain a desired loudness level.

Further, in one embodiment of the invention, a device for HOA loudness level adjustment comprises a HOA loudness measuring unit for measuring loudness of the W-channel of the HOA signal, and a HOA master gain unit for regulating gain of all coefficient channels of the HOA signal according to the measured loudness of the W-channel received from the HOA loudness measuring unit.

Advantageously, measuring the loudness of the W-channel and leveling the HOA master gain can be performed on a transmission side, i.e. before transmitting or storing a HOA formatted audio signal. Further advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 a known solution for using a pink noise test signal to level adjust the sound pressure level of each loudspeaker.

DETAILED DESCRIPTION OF THE INVENTION

Figure 1:
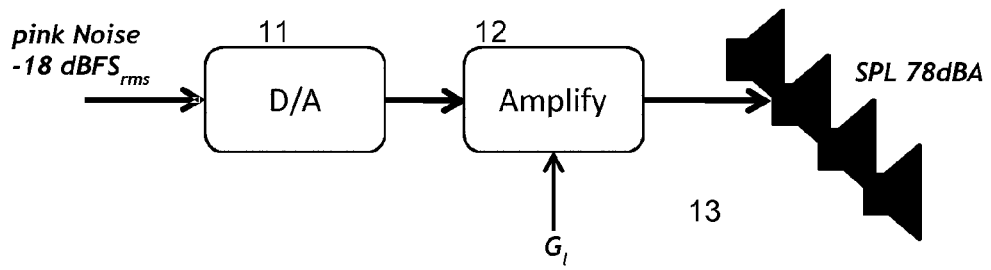
Figure 2:
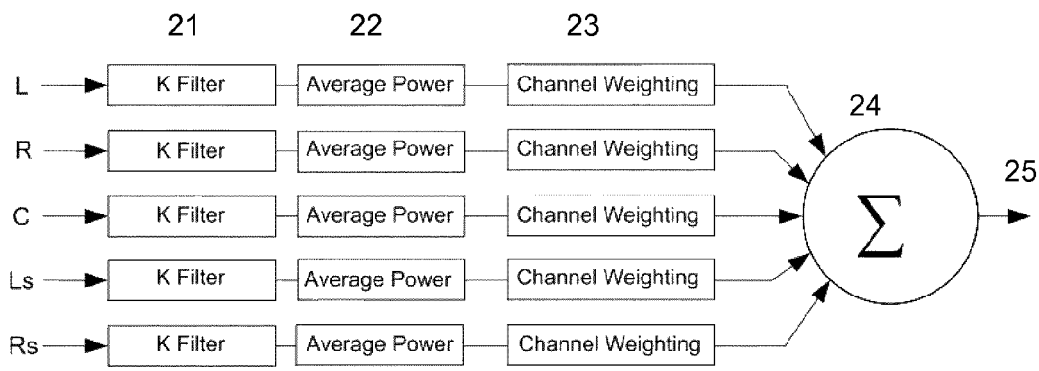
FIG. 2 ITU-R BS.1770 loudness measurement as used in known systems.
Figure 3:
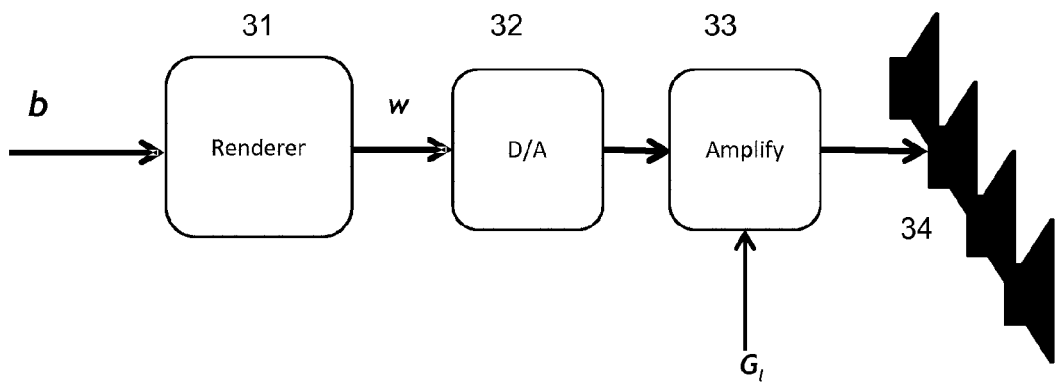
FIG. 3 a structure for content rendering to a special given loudspeaker setup, according to one embodiment of the invention.

FIG. 3 shows an audio playback device, or portion thereof, where content is rendered to any particular speaker setup. The content format can be Higher Order Ambisonics (HOA), Audio Object (AO) or channel based (then it is rendered to a different setup). Replay of the loudspeaker feeds w should be perceived with equal loudness, in particular when switching between items or when rendering to different loudspeaker setups. Input vector b describes a single time sample of a set of signals before rendering of the single time sample. Vector w describes a single time sample of a set of speaker feeds after rendering of the single time sample in a renderer 31. Characteristics of the renderer 31 need to be identical at the production and at the consumer side, or at least need to be known at the production side. After the rendering, the loudspeaker feeds w are converted in a D/A converter 32 from digital to analog, amplified in an amplifier 33 and then fed to loudspeakers 34.

In the following, the desired rendering characteristics are derived, starting with all three content formats (HOA, AO, Channel based) and then going into detail for HOA. It is noted that a HOA signal comprises different partial signals of different order N, such as a signal of order zero (W-channel, N=0), one or more signals of order one (N=1), one or more signals of order two (N=2) etc.

Signal Energy and Perceived Loudness

To simplify the theoretical analysis, we will concentrate on the energy of the signal w (FIG. 3) of a T-time sample block which is defined as follows (details see below):

$$E_w = \|W\|_{fro}^2 = \sum_{i=1}^{\tau}\sum_{l=1}^{L} W_{l,i}^2. \tag{1}$$

Here, W is a matrix of L loudspeaker-channels and τ samples, $W_{l,i}$ are the matrix elements, l denotes the speaker index, i denotes the sample index. The energy $E_w$ gives a fair estimate of the perceived loudness of such an anchor signal for frequencies over 200 Hz, as known from [5]. Because the K-filter suppresses frequencies lower than 200 Hz [2], $E_w$ is approximately proportional to the loudness measure. Loudness measures and energy measures for direct comparison are provided below in Tab.1. As becomes clear, loudness level and signal energy of the HOA W-channel (column "HOA(W)") are very close, substantially equal, to the loudness level and signal energy of the rendered signal (column "Rendered") and the binaural signal (column "Binaural"). The values refer exemplarily to a 22.0 setup (NHK), i.e. with 22 loudspeakers and $4^{th}$ order HOA signals (L=22, N=4).

TABLE 1

HOA and Rendered HOA Loudness levels

| Item | HOA(W) | Rendered | Binaural |
|------|--------|----------|----------|
| 1 | LKFS −30.43 dB | LKFS −30.69 dB | LKFS −29.85 dB |
|   | Energy −33.66 dB | Energy −34.16 dB | Energy −33.27 dB |
| 2 | LKFS −34.99 dB | LKFS −37.42 dB | LKFS −34.76 dB |
|   | Energy −34.72 dB | Energy −37.33 dB | Energy −34.59 dB |
| 3 | LKFS −31.55 dB | LKFS −33.54 dB | LKFS −31.95 dB |
|   | Energy −31.88 dB | Energy −33.95 dB | Energy −32.11 dB |
| 4 | LKFS −23.96 dB | LKFS −25.57 dB | LKFS −23.83 dB |
|   | Energy −25.10 dB | Energy −26.89 dB | Energy −25.14 dB |
| 5 | LKFS −33.58 dB | LKFS −33.88 dB | LKFS −31.15 dB |
|   | Energy −33.22 dB | Energy −33.82 dB | Energy −30.93 dB |
| 6 | LKFS −26.04 dB | LKFS −27.58 dB | LKFS −24.91 dB |
|   | Energy −25.63 dB | Energy −27.64 dB | Energy −25.04 dB |
| 7 | LKFS −27.09 dB | LKFS −27.13 dB | LKFS −26.26 dB |
|   | Energy −27.07 dB | Energy −27.12 dB | Energy −26.57 dB |

Requirements for Renderers

The following simplifications are used: Without loss of generality (i.e. it is not a pre-requisite), a DC free test signal x(t) is assumed. Let A be the RMS value of this signal and $E_A = A^2$ its energy. The test signal is a single source signal from direction $\Omega = (\theta, \phi)^T$, with θ being an elevation and φ being an azimuth. Energy considerations are applied for the optimal listening area, the so-called sweet area.

The test signal can be represented as a channel based signal, an Audio Object or as a HOA signal. The following table presents these representations, where b is the abstract input vector, the channel based representations after rendering are denoted by vector w, the energies after rendering are $E_W$ and the condition for equal energy (loudness) after rendering is $E_A = E_W$. Let D be the generalized rendering matrix:

$$w = Db \tag{2}$$

In Tab.2, an energy preservation requirement $E_A = E_W$ is derived for a directive test signal that is coded as an Audio Object (top row), as a HOA signal (middle row), or as a channel based representation (bottom row). Vector b is the coded input before rendering. Vector w is the signal after rendering (loudspeaker signal before D/A). $E_W$ is the energy after rendering. $E_A = A^2$ is the energy of the test signal x(t), and $t_i$ is a time sample index. Further below, $E_W$ is derived exemplarily for the HOA case.

Within HOA based content, any signal is represented as a superposition of plane waves. A plane wave signal is encoded to HOA by
b = y x($t_i$), where y is the encoding vector consisting of the Spherical Harmonics (SH) of direction $\Omega$. Vectors b and y consist of $(N+1)^2$ elements, where N denotes the HOA order.

TABLE 2

Energy preservation requirement

| Content type | b | w | $E_w$ | $E_A = E_w$ |
|---|---|---|---|---|
| Audio Object | x($t_i$), $\Omega$, single AO (b becomes a scalar) | w = D x($t_i$) = $c_w$x($t_i$) = $(c_{w_1}, c_{w_2}, \ldots)^T$ x($t_i$) with $c_{w_l}$ panning weights, (D becomes a vector) | $c_w^T c_w A^2$ | $1 = c_w^T c_w = \sum_{l=1}^{L} c_{w_l}^2$ |
| HOA | b = y x($t_i$), $(N+1)^2$ elements, with Mode vector, y = $(Y_0^{0*}(\Omega), Y_1^{-1*}(\Omega), \ldots)^T$ SH $Y_n^m(\Omega)$ | w = Db = Dy x($t_i$) D: Decoding Matrix, $c_{w_{HOA}}$ = Dy: HOA panning vector | $y^T D^T D y A^2$ | $1 = y^T D^T D y$ |
| Channel Based | b = $c_b$x($t_i$) = $(c_{b_1}, c_{b_2}, \ldots)^T$ x($t_i$) with $L_b$ panning weights $c_{b_i}$ | w = Db = D$c_b$x($t_i$) $c_{w_{ch}}$ = D$c_b$ -> re-panning vector | $c_b^T D^T D c_b A^2$ | $1 = c_b^T D^T D c_b$ |

Concerning Audio Objects (AO) rendering, the considerations for Audio Objects lead to the well-known requirement that the sum of squared rendering weights $c_w$ equals one:

$$\Sigma_{l=1}^{L} c_{w_l}^2 = 1. \quad (3)$$

The requirement applies also for a superposition of independent AOs, but for correlated AOs the channel based considerations apply.

A requirement for rendering of channel based content is given by $$1 = c_b^T D^T D c_b, \quad (4)$$

where vector $c_b$ contains the panning weights used within content creation and Matrix D the generalized rendering matrix (also called decoding matrix).

Two types of content are exemplarily considered:
1. The original content has been mixed using panning of independent AOs, and the sum of squared panning weights equals one. The rendering requirement then becomes $D^T D = I$ (identity matrix of size $L_b \times L_b$). The resulting requirement for the rendering matrix is discussed below, and a solution according to the invention can be used for this type of content.
2. For microphone recordings and mixed content, the nature of panning weights is unknown, and usually when mixing to a different loudspeaker setup no prediction of the energy of the rendered signals can be made. Thus, a prediction of the loudness after down-mixing or re-rendering is not possible in general, and the invention is not applicable. Here only different approaches seem to be applicable: Separation of directional and non-directional parts to remove any correlation between channels and use of object related rendering methods for the directional content. An ambient mix is then added in a way that the direct to non-directional energy ratio of the original is preserved. The traditional method has been used to create new artistic mixes generated in a mixing studio.

For energy preserving HOA renderers, the HOA rendering requirement is:

$$1 = y^T D^T D y. \quad (5)$$

Due to the orthogonal nature of the SH the vector product $y^T y = (N+1)^2$ (N3D normalized SH).

The requirement $D^T D = I$, where I is a $(N+1)^2 \times (N+1)^2$ identity matrix, is discussed in [5]. The procedures to construct such 'energy preserving' decoding matrices are based on Singular Value Decomposition (SVD). In [5], energy preservation is defined by $$\frac{E_w}{E_b} = \frac{b^T D^T D b}{\|b\|^2} = 1.$$

Steps to derive a rendering matrix $D_n$ fulfilling the requirement of energy preservation are as follows:
1. Derive an energy preserving Rendering Matrix $D_e$. This is possible for many speaker positions as long as the number of speakers L larger or at least equal to the number of HOA coefficients $(N+1)^2$.
2. Make the energy preserving Rendering Matrix independent from the HOA order. Since $D_e$ is constructed such that $$\frac{E_w}{E_b} = 1,$$

the requirement $$\frac{E_w}{E_a} = 1$$

leads to scaling by a factor $$D_n = \frac{D_e}{(N+1)} \quad (6)$$

Figure 4:
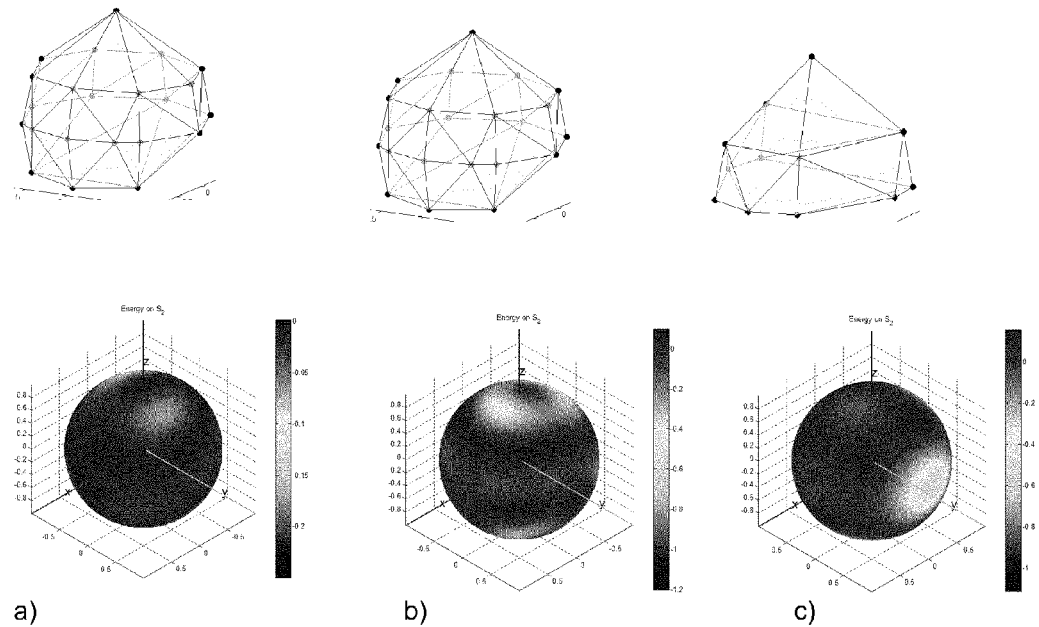
FIG. 4 spatial setup and energy distribution for realistic examples of energy preserving rendering matrices.

For practical HOA renderer construction, the following applies. In practice, positioning of speakers is often non-optimal and $L<(N+1)^2$. Then, rendering matrix design can only come close to theory. Deviations usually are largest in regions with low speaker density, and get larger if increasing the HOA order. Examples are shown in FIG. 4. A good rendering matrix design is characterized by an attenuation of the energy from low speaker density areas, i.e. sound impinging from such directions should be perceived less loud.

FIG. 4 shows real-world examples of energy preserving Rendering Matrices $D_{HOA}$. In the top row, there are various loudspeaker setups for different HOA orders, and in the bottom row the respective directional energy preservation characteristics. 6724 plane waves with equally spaced directions sampling the sphere are HOA encoded and rendered to 22 or 12 channel setups. The directional energy preservation is shown in grey levels, and the different setups and their minimum and maximum values are as follows:

FIG. 4 a) shows a 22_NHK_45 setup with HOA order N=4: [−0.2 dB; 0.0 dB]

FIG. 4 b) shows a 22_NHK_45 setup with HOA order N=6: [−1.2 dB; 0.1 dB]

FIG. 4 c) shows a 12_SwissAudec_110 setup with HOA order N=3: [−1.1 dB; 0.2 dB]

As can be seen, signal energy is rather evenly distributed for the 22 channel setup with N=4, so that deviations of only 0.2 dB occur. For the 22-channel setup with N=6 and the 12 channel setup with N=3, signal energy is still rather evenly distributed, but already with deviations of 1.3 dB (even for directions where no loudspeaker is available). Even distribution of signal energy is an advantage of energy preserving rendering.

Because energy preservation is only possible if the loudspeakers span a complete convex hull around the listening position, the steps of rendering construction become:

1. Construct an approximately energy preserving rendering matrix D. Two suitable methods are described in [5], [6]. Energy preservation should be accurate in the frontal region, and can be less accurate in back-bottom or side regions.
2. Because the of Cauchy-Schwarz inequality (see below) the rendering matrix can then be normalized by:

$$D_n = \frac{D}{\|D\|_{fro}}. \quad (7)$$

This replaces eq. (6) for near energy preserving matrices, and eq. (6) can be seen as a special case of eq. (7). An alternative is normalizing the rendering matrix using a test signal of unit energy impinging from the center ($\Omega_c=(0,0)^T$):

$$\hat{D}_n = \frac{D}{\|Dy\|_2^2}, \quad (8)$$

with mode vector $y=(Y_0^0(\Omega_c), Y_{-1}^1(\Omega_c), \ldots, Y_n^m(\Omega_c), \ldots, Y_N^N(\Omega c))^T$, and Spherical Harmonics $Y_n^m(\Omega_c)$ of direction $\Omega_c$. The mode vector y can be a HOA test signal composed of Spherical Harmonics of direction $\Omega_c$.

Reference HOA content has been used to evaluate the above considerations in practical studies using energy and loudness measures. Loudness measures were conducted for the HOA zero order coefficient channel (W-channel), for the multichannel signal after rendering (with channel weights of 1 for setups with more than five channels), and for the binaural down-mix of the multichannel signal using Binaural Room Impulse Responses (BRIRs) of Technicolor's listening room and calibration by a −23 LKFS test signal from the center speaker channel. In parallel, energy measures were conducted. The energy measures (full file) match the loudness measures very closely, except for items with silent passages. These passages are ignored for LKFS measures, so values are higher here. This proves the assumption that energy measures give an estimate of perceived loudness. The measurement data are provided below. Some evaluations of the data are presented in the following. They are confirmed by informal listening tests. LKFS measurement accuracy is +/−2 dB.

Figure 5:
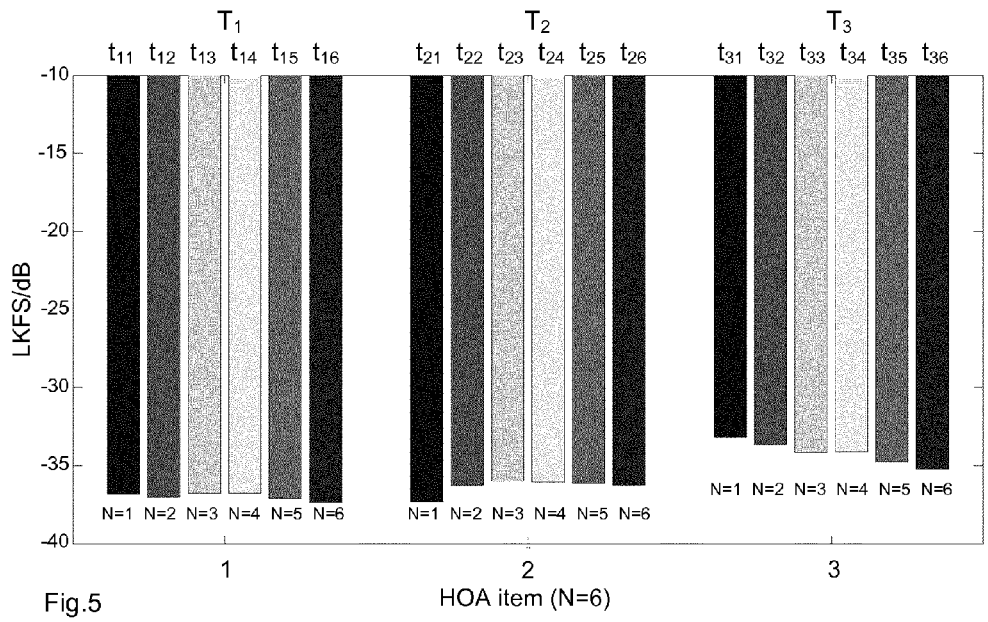
FIG. 5 binaural loudness values of 3 test items rendered to a 22.0 channel setup for rendering orders N=1-6.

The following refers to loudness preservation when rendering for different HOA orders. FIG. 5 shows loudness preservation when rendering for different HOA orders for a 22.0 loudspeaker channel setup. Binaural loudness measures of three test items $T_1,T_2,T_3$ are rendered in a manner according to the invention to a 22.0 channel setup for rendering orders N=1 . . . 6. The test item order was N=6 and the renderer ignores higher order components when rendering for lower orders. The measures for the first test item $T_1$ are $t_{11}$ for order N=1, $t_{12}$ for order N=2 etc., and correspondingly for the second and third test item $T_2,T_3$. As can be seen, partial signals with different rendering orders (i.e. the components of each test item) are rendered with substantially same loudness, independent of their rendering order.

Figure 6:
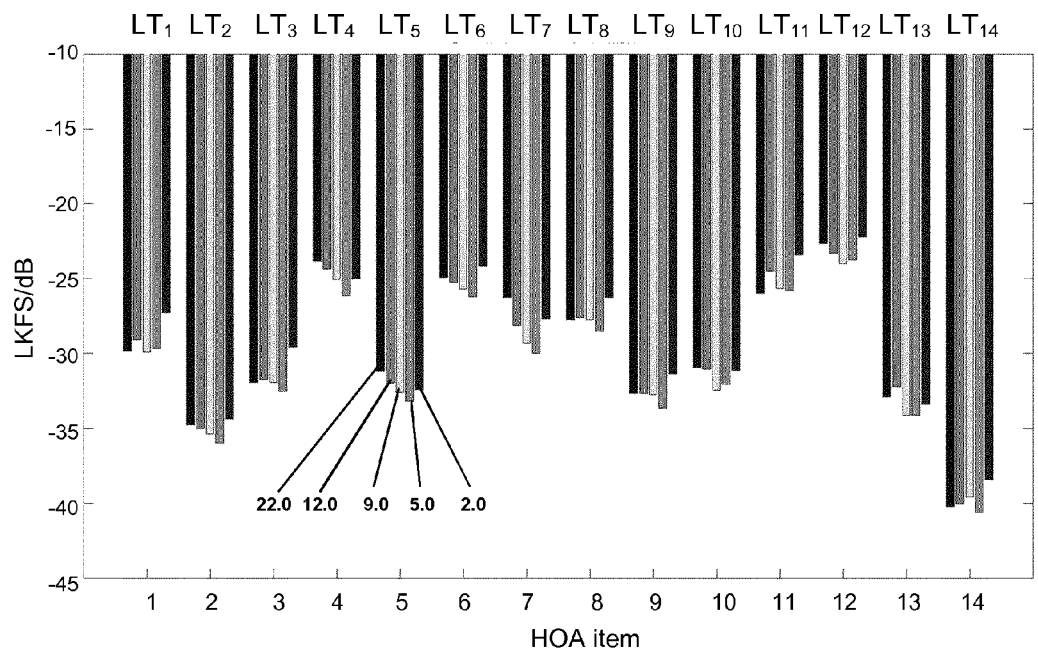
FIG. 6 binaural loudness values of test items rendered to five different speaker setups with a rendering according to the invention.

The following refers to loudness preservation when rendering to different loudspeaker setups. FIG. 6 shows loudness preservation when rendering fourteen HOA test items $LT_1, \ldots, LT_{14}$ with N=4 (i.e. $4^{th}$ order) to five different loudspeaker setups. In each group of five columns, i.e. each test item, the columns (left to right) correspond to the selected loudspeaker setups of: 22.0 (CfP), 12.0 (Auro3D), 9.0 (Auro3D), 5.0 (ITU), 2.0(+/−30°. As can be seen, differences in each group of five columns are very small. That is, a given signal is rendered with substantially same loudness, independent of the loudspeaker setups and the number of loudspeakers. As theoretical energy preservation degrades with less speakers (especially the 2D setups), the normalization of the rendering matrix according to eq. (7) leads to practically usable improved renderers.

Figure 7:
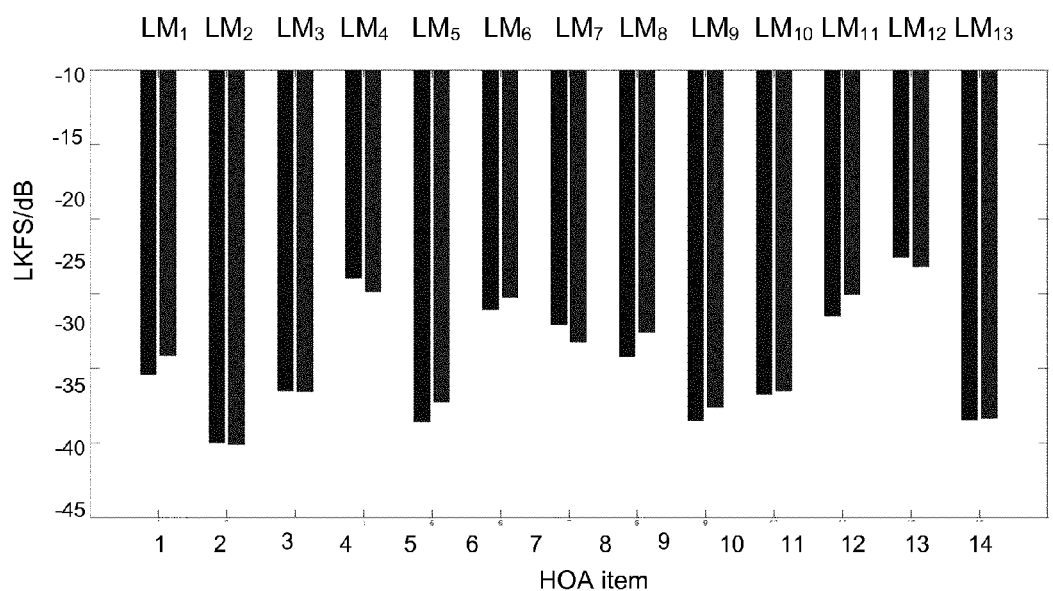
FIG. 7 loudness values of HOA W-channel signals compared to mean loudness after rendering.

The following refers to the first order HOA W-channel and item loudness after rendering. Using N3D normalization, the $0^{th}$-order coefficient channel contains a non-scaled mono version of the rendered outputs of approximately equal energy and loudness. FIG. 7 shows this correlation for thirteen N=4 test items $LM_1, \ldots, LM_{13}$ (i.e. test signals) from Technicolor, i.e. loudness measure of the HOA W-channel signal compared to mean loudness after rendering. The mono channel LKFS measure (left-hand column for each test item) is compared to the mean of the binaural LKFS measures (right-hand column for each test item) of the five different speaker setups of FIG. 6. A surprising observation is that both are substantially equal. Thus, the HOA W-channel can be used as estimate of the overall loudness after rendering. This feature can be used for setting up the loudness level for live HOA broadcast recording when using a microphone array or when monitoring loudness within content production.

According to the invention, perceived loudness can be normalized if the mixing facility at a production site and presentation venues at a consumer's site use the same loud-speaker level calibration, as well as renderers with special energy preservation characteristics. Energy preservation describes the characteristics of a render that preserves the energy of a directive source signal from arbitrary directions. This applies to all 3D Audio output formats, among them at least Audio Object, Channel based and HOA.

The HOA content is loudness level calibrated, e.g. by listening, at the mixing facility, wherein energy preserving rendering is used for monitoring. An adequate master gain is applied to the HOA content (all coefficient channels), which is then stored for distribution. Further, energy preserving rendering is also used at the presentation venues.

In practice, HOA renders can be constructed that are energy preserving at least in areas between loudspeakers (i.e. locations between loudspeaker positions). A normalization of the rendering matrix that leads to good loudness preservation results is a normalization by $$D_n = \frac{D}{\|D\|_{fro}}.$$

LKFS loudness measures of the HOA zero order coefficient channel (W-channel) then roughly match the loudness measures of the related channel representations or their related binaural down-mixes. Thus, it can be used to monitor loudness within content production, especially within broadcast and, in particular, live broadcast. However, it can also be advantageous for monitoring recorded content.

The present invention provides, in one embodiment, a method for adjusting the loudness level of Higher Order Ambisonics (HOA) content, so that rendering and replay on sound pressure level calibrated 3D Audio systems can be perceived with equal loudness when listening in different venues and/or with different speaker setups. HOA encoding of content needs to be specified and renderers need to share the common property of energy preservation.

In one embodiment, the invention relates to a tool for monitoring the HOA content loudness that can be used e.g. for live broadcast of HOA signals, AO signals or channel based signals which are created using HOA microphone recordings.

In the following, a HOA system for live Broadcast is described. HOA microphone arrays allow capturing 3D Audio in real time, without post processing in a studio. Thus, such a content capturing system is well-suited for live Broadcast events like e.g. sport and/or concert events. The following describes a system to set-up and monitor the loudness of the 3D content.

Figure 8:
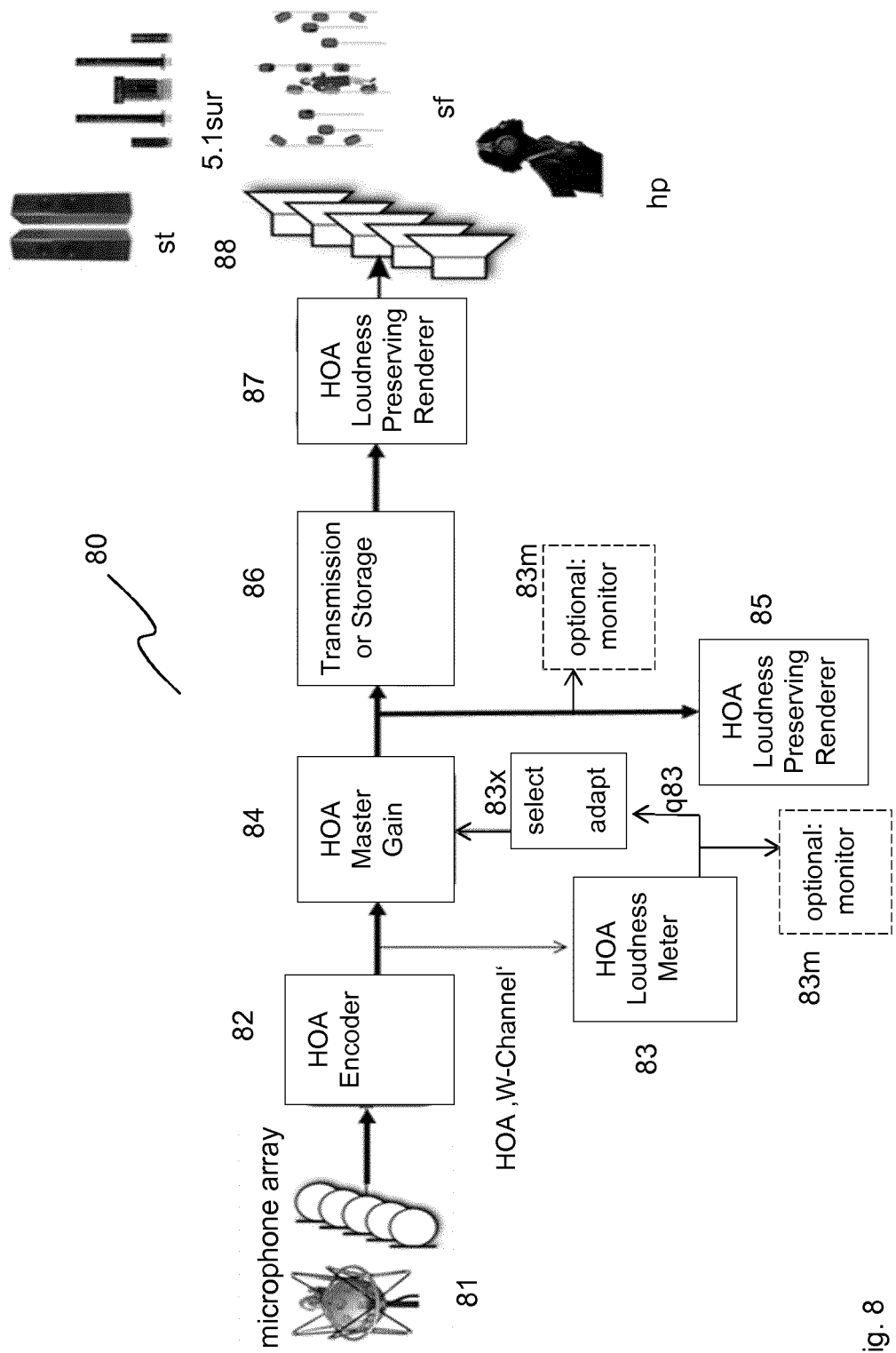
FIG. 8 a system according to the invention, usable e.g. for HOA live broadcast.

FIG. 8 depicts one embodiment of the HOA system 80. First, a microphone (or microphone array) 81 is positioned within the critical distance to the event to record, so that the analog setup (like proper pre-amplification) is maintained. The microphone 81 provides its output to a real-time HOA Encoder 82 that generates an encoded HOA formatted signal. The HOA formatted signal is provided to a HOA Loudness Meter 83, i.e. a unit that evaluates the HOA zero order channel (HOA W-channel) and computes LKFS (LUFS) loudness measurements. The W-channel can be extracted from the HOA signal within the HOA Encoder 82, the HOA Loudness Meter 83 or a W-channel extraction unit (not shown). The HOA Loudness Meter 83 provides momentary, short-term and integrated loudness measures q83 [1],[2] to a HOA Master Gain unit 84. In one embodiment, the loudness measures may also be, manually or automatically, adapted and/or selected in an optional Adaption/Selection unit 83x before being provided to the HOA Master Gain unit 84. In one embodiment, the HOA Loudness Meter 83 performs related energy measures, which are used to set the gain in the HOA Master Gain unit 84 and to adjust the loudness.

An optional second HOA Loudness Metering unit 83m may be attached after the HOA Master Gain unit 84 for monitoring reasons, and/or—particularly for more complex systems—an optional first HOA Loudness Preserving renderer 85 can be used for monitoring. A good practical solution is to use a speech anchor test recording to set up the initial master gain.

After transmission 86 by a transmitter (or after storage by a storage unit respectively) and reception by a receiver (or retrieval of stored content by a retrieve unit respectively) in consumer devices, a second HOA Loudness Preserving Renderer 87 is used to render the audio content to a desired loudspeaker setup 88. Different loudspeaker setups 88 can be used, such as e.g. stereo st, 5.1 surround sound 5.1sur, other 3D sound fields sf or headphones hp. One advantage of the HOA format is that it is relatively simple to optimize its rendering at high quality to any particular loudspeaker setup.

In principle, the HOA system 80 can be understood as including at least two portions: an encoding portion and a decoding portion. The encoding portion includes the Encoder unit 82, the Loudness Meter 83, Master Gain unit 84 and, optionally, one or more of the Adaption/Selection unit 83x, the Loudness Metering unit 83m and the first Loudness Preserving Renderer 85. The decoding portion in a receiver includes at least the loudness preserving rendering unit 87. If the encoding portion and the decoding portion are connected through a storage device, the storage device may be part of either of them or may be separate.

Figure 9:
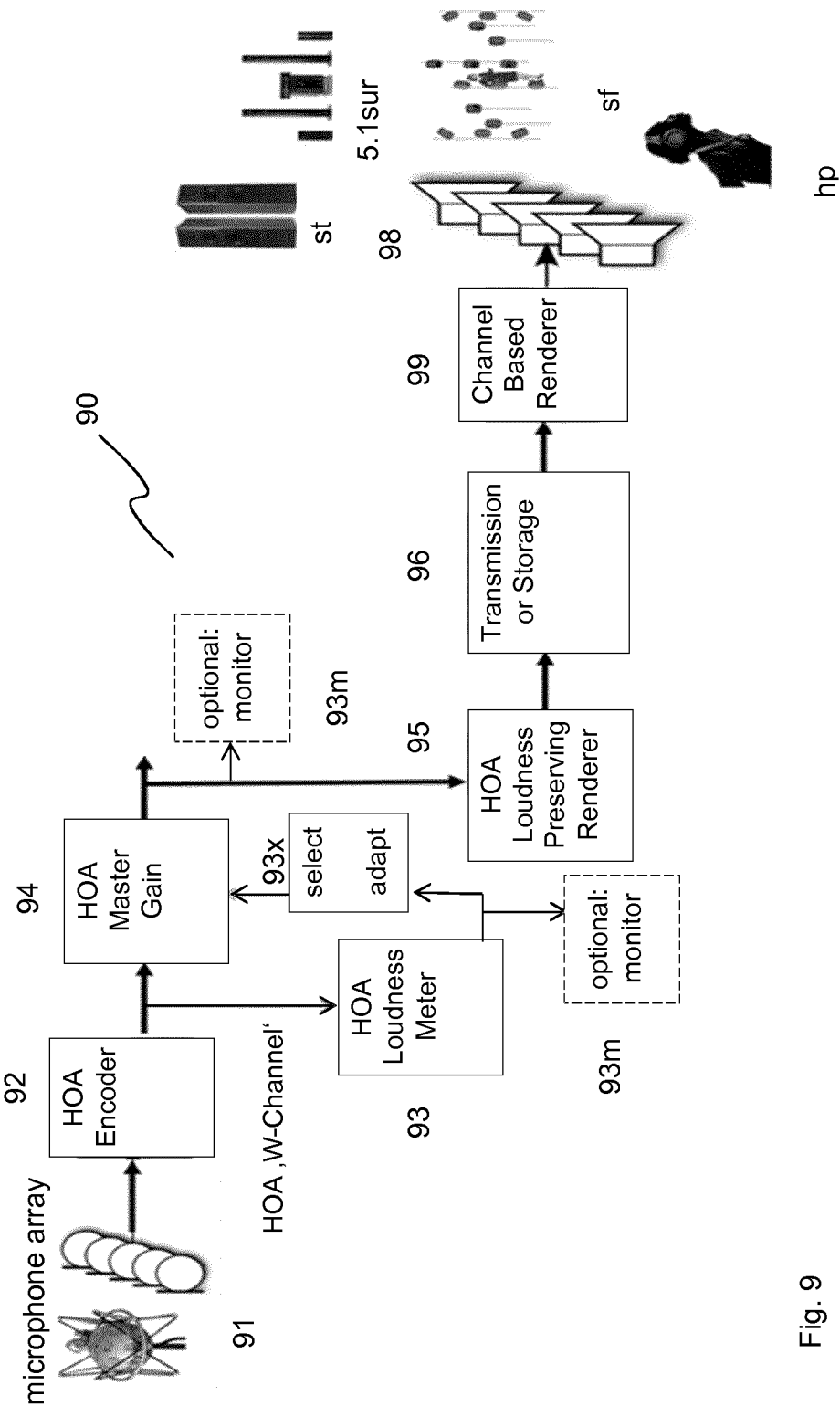
FIG. 9 a system for channel based transmission systems.

FIG. 9 depicts, in one embodiment, a system 90 for channel based transmission or playback. The HOA signal is captured and loudness adjusted as described before, using a microphone/microphone array 91, HOA encoder 92, HOA Master Gain unit 94, HOA Loudness Meter 93 and HOA Loudness Preserving Renderer 95. An optional second HOA Loudness Metering unit 93m may be attached after the HOA Master Gain unit 94 for monitoring reasons. The HOA Loudness Preserving Renderer 95 is in this embodiment no longer optional. In one embodiment, the loudness measures may also be, manually or automatically, adapted and/or selected in an optional Adaption/Selection unit 93x before being provided to the HOA Master Gain unit 94.

The channel based audio provided by the HOA Loudness Preserving Renderer 95 is then transmitted or stored in a Transmission unit or Storage unit 96. The speaker positions of the transmission setup and/or a flag indicating the original content format are added as metadata to the signal. Thus, the speaker positions of the transmission setup, and/or a flag signaling that the original content has been HOA, are included as metadata in the transmitted or stored signal. After transmission/storage and content reception at the consumer side, an energy preserving Channel Based renderer 99 is used to render the data to the consumer's loudspeakers setup 98, in one embodiment. In another embodiment (not shown), an energy pre-serving Channel Based renderer 99 is used to render the data to a pre-determined or individual loudspeakers setup 98 before the transmission or storage. In either case, the Channel Based renderer 99 works according to eq. (4). Different loudspeaker setups are possible, as mentioned above.

Alternatively, the Channel Based content can be re-encoded to HOA using the transmitted metadata in a second HOA encoding unit (not shown, e.g. instead of the Channel Based renderer 99), wherein the second HOA encoding unit is preferably a loudness preserving HOA render.

Now the HOA Loudness Meter 83,93 will be described. As an input signal, the N3D normalized zero order HOA coefficient channel is used. The processing is analog to [1],[2], where a processing is described only for a mono channel. In various different embodiments, the HOA loudness meter 83,93 can show one or more of momentary, short-term and integrated loudness measures. These differ mainly by the time frame that is used for the loudness measuring.

Under the condition that loudness preserving renderers are used, these measures allow to draw inferences about the (target) loudness that will be obtained after rendering at the consumer's loudspeaker setup. For example, the measures can be used to keep a decent listening level without loudness jumps when switching between different content or different programs. With Sound Pressure Level (SPL) calibrated systems, equal loudness can be realized.

Loudness preserving renderers need to fulfill (at least approximately) the following requirements:
for AO based content: equation (3);
for channel based content: equation (4); and
for HOA based content: equation (5).

In one embodiment, HOA renderers use a rendering matrix normalization according to equations (6), (7), (8).

The following energy calculations derive the signal energy $E_W$ after HOA rendering. The test signal is a DC free time signal $x(t)$ with a RMS value of A and energy $E_A = A^2$ impinging from direction $\Omega = (\theta, \phi)^T$, $\theta$ elevation, $\phi$ azimuth. Let x denote a vector of T samples, $x = (x(t_1), x(t_i), \ldots, x(t_\tau))^T$ $$E_A = x^T x = A^2. \tag{9}$$

HOA encoding is given by:

$$B = y \, x^T, \tag{10}$$

with vector $y = (Y_0^{0*}(\Omega), Y_1^{-1*}(\Omega), \ldots)^T$ assembled from real valued Spherical Harmonics of direction $\Omega$. $B \in \mathbb{R}^{(N+1)^2 \times \tau}$ with matrix elements $B_{o,i}$, with order index o and time sample index i.

The Energy in HOA domain is given by the squared Frobenius norm of matrix B:

$$E_B = \sum_{i=1}^{\tau} \sum_{o=1}^{(N+1)^2} B_{o,i}^2 = \|B\|_{fro}^2 \tag{11}$$

and with above encoding equation becomes:

$$E_B = \sum_{i=1}^{\tau} x(t_i)^2 \sum_{o=1}^{(N+1)^2} y_o^2 = A^2 y^T y \tag{12}$$

The loudspeaker signals W are given after rendering with matrix $D \in \mathbb{R}^{L \times (N+1)^2}$ by $$W = D \, B, \tag{13}$$

with $W \in \mathbb{R}^{L \times \tau}$. W is computed from the column vectors $b_i$ of B by $$W = (Db_1, \ldots Db_i, \ldots Db_\tau). \tag{14}$$

The energy of the speaker signals is given by the squared Frobenius norm of matrix W.

$$E_W = \sum_{i=1}^{\tau} \sum_{l}^{L} W_{l,i}^2 = \|W\|_{fro}^2 = \|(Db_1, \ldots Db_i, \ldots Db_\tau)\|_{fro}^2. \tag{15}$$

This can be rewritten using sum of columns and the Euclidian vector norm for the columns $b_i$:

$$E_W = \sum_{i=1}^{\tau} \|Db_i\|^2 = \sum_{i=1}^{\tau} \|Dy \, x(t_i)\|^2 = \sum_{i=1}^{\tau} x(t_i)^2 \|Dy\|^2 = A^2 \|Dy\|^2 \tag{16}$$

and with $\|Dy\|^2 = (Dy)^T Dy$:

$$E_W = \sum_{i=1}^{\tau} x(t_i)^2 y^T D^T D y = A^2 y^T D^T D y \tag{17}$$

Decoding matrix normalization is explained in the following, i.e. how eq. (7) and eq. (6), as a special case of eq. (7), are derived. The Cauchy-Schwarz inequality is defined for arbitrary matrices using the Frobenius norm:

$$E_W = \|W\|_{fro}^2 = \|DB\|_{fro}^2 \leq \|D\|_{fro}^2 \|B\|_{fro}^2 = \|D\|_{fro}^2 E_B \tag{18}$$

From this, a simple normalization for rendering matrices D follows:

$$D_n = \frac{D}{\|D\|_{fro}} \tag{19}$$

Perfect energy preservation can only occur if the number of loudspeakers is larger or equal the number of HOA coefficients $(L \leq (N+1)^2)$. If the rendering matrix D is perfectly energy preserving, its Singular Value Decomposition becomes: $D = UIV$, where $U,V$ are unitary matrices and I is a unit matrix of size $(N+1)^2 \times (N+1)^2$. The Frobenius norm is invariant under unitary transformations and $\|D\|_{fro}^2 = \|I\|_{fro}^2 = \Sigma \text{diag}(I)$ in this case. This leads directly to eq. (6).

While there has been shown, described, and pointed out fundamental novel features of the present invention as applied to preferred embodiments thereof, it will be understood that various omissions and substitutions and changes in the apparatus and method described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated. It will be understood that the present invention has been described purely by way of example, and modifications of detail can be made without departing from the scope of the invention. Each feature disclosed in the description and (where appropriate) the claims and drawings may be provided independently or in any appropriate combination. Features may, where appropriate be implemented in hardware, software, or a combination of the two. Connections may, where applicable, be implemented as wireless connections or wired, not necessarily direct or dedicated, connections.

CITED REFERENCES

[1] ISO/IEC JTC1/SC29/WG11/N13196, 'Calibration of 22.2 multichannel sound reproduction', Audio Subgroup, October 2012, Shanghai, China
[2] EBU Technical Recommendation R128, "Loudness Normalization and Permitted Maximum Level of Audio Signals", Geneva, 2010. [http://tech.ebu.ch/docs/r/r128.pdf]
[3] ITU-R Recommendation BS.1770-2, "Algorithms to measure audio programme loudness and true-peak audio level", Geneva, 2011
[4] ATSC A/85, "Techniques for Establishing and Maintaining Audio Loudness for Digital Television", Advanced Television Systems Committee, Washington, D.C., Jul. 25, 2011.
[5] F. Zotter, H. Pomberger, M. Noisternig, "Energy-Preserving Ambisonic Decoding", ACTA ACUSTICA UNITED with ACUSTICA, Vol. 98 (2012), pages 37-47
[6] F. Zotter, M. Frank, "All-Round Ambisonic Panning and Decoding", J. Audio End. Soc., Vol. 60, No. 10, 2012 October

The invention claimed is:

1. A method for adjusting a loudness level of a Higher Order Ambisonics (HOA) formatted 3D audio signal, the 3D audio signal having at least a coefficient channel with coefficients of $0^{th}$ order and one or more coefficient channels with coefficients of an order higher than zero, the method comprising:
    measuring loudness of the coefficient channel with coefficients of $0^{th}$ order of the 3D audio signal; and
    level adjusting a master gain for all coefficient channels of the 3D audio signal according to the measured loudness of the coefficient channel with coefficients of $0^{th}$ order, wherein a level adjusted HOA signal is obtained.

2. The method of claim 1, further comprising steps of rendering the 3D audio signal, wherein a normalized rendering matrix is used, and monitoring the loudness of the rendered signal.

3. The method according to claim 2, wherein the rendering uses a rendering matrix that is normalized with a normalization factor $D_n$, according to $$D_n = \frac{D_e}{(N+1)},$$

wherein $D_e$ is the energy preserving rendering matrix, or according to $$D_n = \frac{D}{\|D\|_{fro}},$$

wherein D is an approximately energy preserving rendering matrix.

4. The method according to claim 2, wherein the rendering uses a rendering matrix that is normalized with a normalization factor $\hat{D}_n$ according to $$\hat{D}_n = \frac{D}{\|Dy\|_2^2},$$

wherein y is a HOA test signal composed of Spherical Harmonics of direction $\Omega_c$ and D is an approximately energy preserving rendering matrix.

5. The method according to claim 1, further comprising rendering the signal resulting from said level adjusting step and transmitting the rendered signal, wherein the rendering uses an energy preserving rendering matrix that is normalized with a normalization factor according to $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

6. The method according to claim 1, further comprising transmitting, receiving and rendering the signal resulting from said level adjusting step, wherein the rendering after transmitting and receiving uses an energy preserving rendering matrix that is normalized with a normalization factor according to $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

7. The method according to claim 1, wherein the measuring loudness of the coefficient channel and level adjusting a master gain are performed on a transmitting side, before a step of transmission or storage.

8. The method of claim 1, wherein said measuring loudness results in momentary, short-term and integrated loudness measures that are input to the level adjusting.

9. A device for loudness level adjustment for Higher Order Ambisonics (HOA) formatted 3D audio signals, the 3D audio signal having at least a coefficient channel with coefficients of $0^{th}$ order and one or more coefficient channels with coefficients of an order higher than zero, the device comprising:
    a loudness measuring unit for measuring loudness of the coefficient channel with coefficients of $0^{th}$ order; and
    a master gain unit for regulating gain of all coefficient channels of the 3D audio signal according to the measured loudness received from the loudness measuring unit, the master gain unit providing a level adjusted HOA signal.

10. The device of claim 9, further comprising a monitoring unit for rendering the level adjusted HOA signal, wherein a normalized rendering matrix is used, and for monitoring the loudness of the rendered signal, wherein the monitored loudness is used to control the HOA loudness measuring unit.

11. The device according to claim 9, wherein the loudness measuring unit provides momentary, short-term and integrated loudness measures to the master gain unit.

12. The device according to claim 9, further comprising a renderer for rendering said level adjusted HOA signal obtained from the master gain unit, wherein an energy preserving rendering matrix is used that is normalized with a normalization factor according to:

$$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$; and
a transmitter for transmitting the rendered signal.

13. The device according to claim 9, further comprising:
a transmitter for transmitting said level adjusted HOA signal obtained from the master gain unit;
a receiver for receiving the transmitted signal; and
a renderer for rendering the received signal, wherein an energy preserving rendering matrix is used that is normalized with a normalization factor according to $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

14. The device according to claim 9, further comprising:
a storage for storing said level adjusted HOA signal obtained from the master gain unit;
a retrieve unit for retrieving the stored signal; and
a renderer for rendering the retrieved signal, wherein the rendering uses an energy preserving rendering matrix that is normalized with a normalization factor according to $D_n=$ $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

15. A device for audio reproduction comprising:
a decoder including a HOA Loudness preserving renderer configured to render content based on a rendering matrix, wherein the rendering matrix is normalized and wherein the rendering matrix is substantially energy preserving and wherein the rendering matrix is normalized in a normalization unit according to $$D_n = \frac{D}{\|D\|_{fro}},$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$, or according to $$D_n = \frac{D_e}{(N+1)},$$

wherein $D_e$ is the energy preserving rendering matrix.

16. A computer readable non-transitory storage medium having stored thereon instructions that when executed on a computer cause the computer to perform a method for adjusting a loudness level of a Higher Order Ambisonics formatted 3D audio signal, the 3D audio signal having at least a coefficient channel with coefficients of $0^{th}$ order and one or more coefficient channels with coefficients of an order higher than zero, the method comprising:
measuring loudness of the coefficient channel with coefficients of $0^{th}$ order of the 3D audio signal; and
level adjusting a master gain for all coefficient channels of the 3D audio signal according to the measured loudness of the coefficient channel with coefficients of $0^{th}$ order, wherein a level adjusted Higher Order Ambisonics signal is obtained.

17. The storage medium of claim 16, wherein the method further comprises rendering the 3D audio signal, wherein a normalized rendering matrix is used, and monitoring the loudness of the rendered signal.

18. The storage medium of claim 17, wherein the rendering uses a rendering matrix that is normalized with a normalization factor $D_n$ according to $$D_n = \frac{D_e}{(N+1)},$$

wherein $D_e$ is the energy preserving rendering matrix, or according to $$D_n = \frac{D}{\|D\|_{fro}},$$

wherein D is an approximately energy preserving rendering matrix.

19. The storage medium of claim 17, wherein the rendering uses a rendering matrix that is normalized with a normalization factor $\hat{D}_n$ according to $$\hat{D}_n = \frac{D}{\|Dy\|_2^2},$$

wherein y is a HOA test signal composed of Spherical Harmonics of direction $\Omega_c$ and D is an approximately energy preserving rendering matrix.

20. The storage medium of claim 16, wherein the method further comprises rendering the signal resulting from said level adjusting step and transmitting the rendered signal, wherein the rendering uses an energy preserving rendering matrix that is normalized with a normalization factor according to $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

21. The storage medium of claim 16, wherein the method further comprises transmitting, receiving and rendering the signal resulting from said level adjusting step, wherein the rendering after transmitting and receiving uses an energy preserving rendering matrix that is normalized with a normalization factor according to $$D_n = \frac{D}{\|D\|_{fro}}$$

or according to $$\hat{D}_n = \frac{D}{\|Dy\|_2^2},$$

wherein D is an approximately energy preserving rendering matrix and y is a HOA test signal composed of Spherical Harmonics of direction $\Omega_c$.

22. The storage medium of claim 16, wherein in the method the measuring loudness of the coefficient channel and level adjusting a master gain are performed on a transmitting side, before a step of transmission or storage.

23. The storage medium of claim 16, wherein in the method said measuring loudness results in momentary, short-term and integrated loudness measures that are input to the level adjusting.

* * * * *